(12) United States Patent
Chen et al.

(10) Patent No.: US 9,258,922 B2
(45) Date of Patent: *Feb. 9, 2016

(54) POP STRUCTURES INCLUDING THROUGH-ASSEMBLY VIA MODULES

(75) Inventors: Chih-Hua Chen, Jhubei (TW); Chen-Shien Chen, Zhubei (TW); Ching-Wen Hsiao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 808 days.

This patent is subject to a terminal disclaimer.

(21) Appl. No.: 13/352,937

(22) Filed: Jan. 18, 2012

(65) Prior Publication Data

US 2013/0182402 A1 Jul. 18, 2013

(51) Int. Cl.
*H05K 7/04* (2006.01)
*H05K 7/10* (2006.01)
(Continued)

(52) U.S. Cl.
CPC .......... *H05K 7/1061* (2013.01); *H01L 21/6835* (2013.01); *H01L 23/49827* (2013.01); *H01L 23/5389* (2013.01); *H01L 24/19* (2013.01); *H01L 25/105* (2013.01); *H01L 21/568* (2013.01); *H01L 23/49816* (2013.01); *H01L 23/49838* (2013.01); *H01L 25/0657* (2013.01); *H01L 2221/6834* (2013.01); *H01L 2221/68327* (2013.01); *H01L 2221/68363* (2013.01); *H01L 2221/68381* (2013.01);
(Continued)

(58) Field of Classification Search
CPC ....... H05K 1/113; H05K 1/117; H05K 1/144; H05K 1/162; H05K 2201/095

USPC ................. 361/760, 790, 792, 795, 804, 807, 361/809–811
See application file for complete search history.

(56) References Cited

U.S. PATENT DOCUMENTS 6,281,046 B1 8/2001 Lam
8,476,769 B2 7/2013 Chen et al.
(Continued)

FOREIGN PATENT DOCUMENTS

TW 200919632 A 5/2009

OTHER PUBLICATIONS

Cheah, Bok Eng, et al., "A Novel Inter-Package Connection for Advanced Package-on-Package Enabling," IEEE Electronic Components and Technology Conference, May 31, 2011-Jun. 3, 2011, pp. 589-594.

*Primary Examiner* — Jerry Wu
*Assistant Examiner* — Christopher L Augustin
(74) *Attorney, Agent, or Firm* — Slater & Matsil, L.L.P.

(57) ABSTRACT

A device includes a Through-Assembly Via (TAV) Module, which includes a substrate, a plurality of through-vias penetrating through the substrate, and a second plurality of metal posts at a bottom surface of the TAV module and electrically coupled to the plurality of through-vias. A polymer includes a first portion between and contacting sidewalls of the first package component and the TAV module, a second portion disposed between the first plurality of metal posts, and a third portion disposed between the second plurality of metal posts. A first plurality of Redistribution Lines (RDLs) is underlying a bottom surface of the second and the third portions of the polymer. A second plurality of RDLs is over the first package component and the TAV module. The first plurality of RDLs is electrically coupled to the second plurality of RDLs through the plurality of through-vias in the TAV module.

18 Claims, 11 Drawing Sheets

(51) Int. Cl.
 *H01L 23/538* (2006.01)
 *H01L 25/10* (2006.01)
 *H01L 21/683* (2006.01)
 *H01L 23/00* (2006.01)
 *H01L 23/498* (2006.01)
 *H01L 25/065* (2006.01)
 *H01L 21/56* (2006.01)

(52) U.S. Cl.
 CPC ........... *H01L 2224/12105* (2013.01); *H01L 2224/16225* (2013.01); *H01L 2224/32145* (2013.01); *H01L 2224/32225* (2013.01); *H01L 2224/73204* (2013.01); *H01L 2224/73253* (2013.01); *H01L 2224/73267* (2013.01); *H01L 2224/9202* (2013.01); *H01L 2224/9222* (2013.01); *H01L 2225/06513* (2013.01); *H01L 2225/06541* (2013.01); *H01L 2225/06565* (2013.01); *H01L 2225/1035* (2013.01); *H01L 2225/1041* (2013.01); *H01L 2225/1058* (2013.01); *H01L 2924/15311* (2013.01); *H01L 2924/15788* (2013.01)

(56) References Cited

U.S. PATENT DOCUMENTS

| | | | |
|---|---|---|---|
| 2008/0006936 A1* | 1/2008 | Hsu | 257/731 |
| 2008/0277800 A1 | 11/2008 | Hwang et al. | |
| 2009/0155957 A1 | 6/2009 | Chen et al. | |
| 2009/0242252 A1* | 10/2009 | Tanaka | 174/260 |
| 2012/0273960 A1* | 11/2012 | Park et al. | 257/774 |
| 2012/0319295 A1* | 12/2012 | Chi et al. | 257/774 |
| 2013/0009322 A1 | 1/2013 | Conn et al. | |
| 2013/0181325 A1* | 7/2013 | Chen et al. | 257/532 |

* cited by examiner

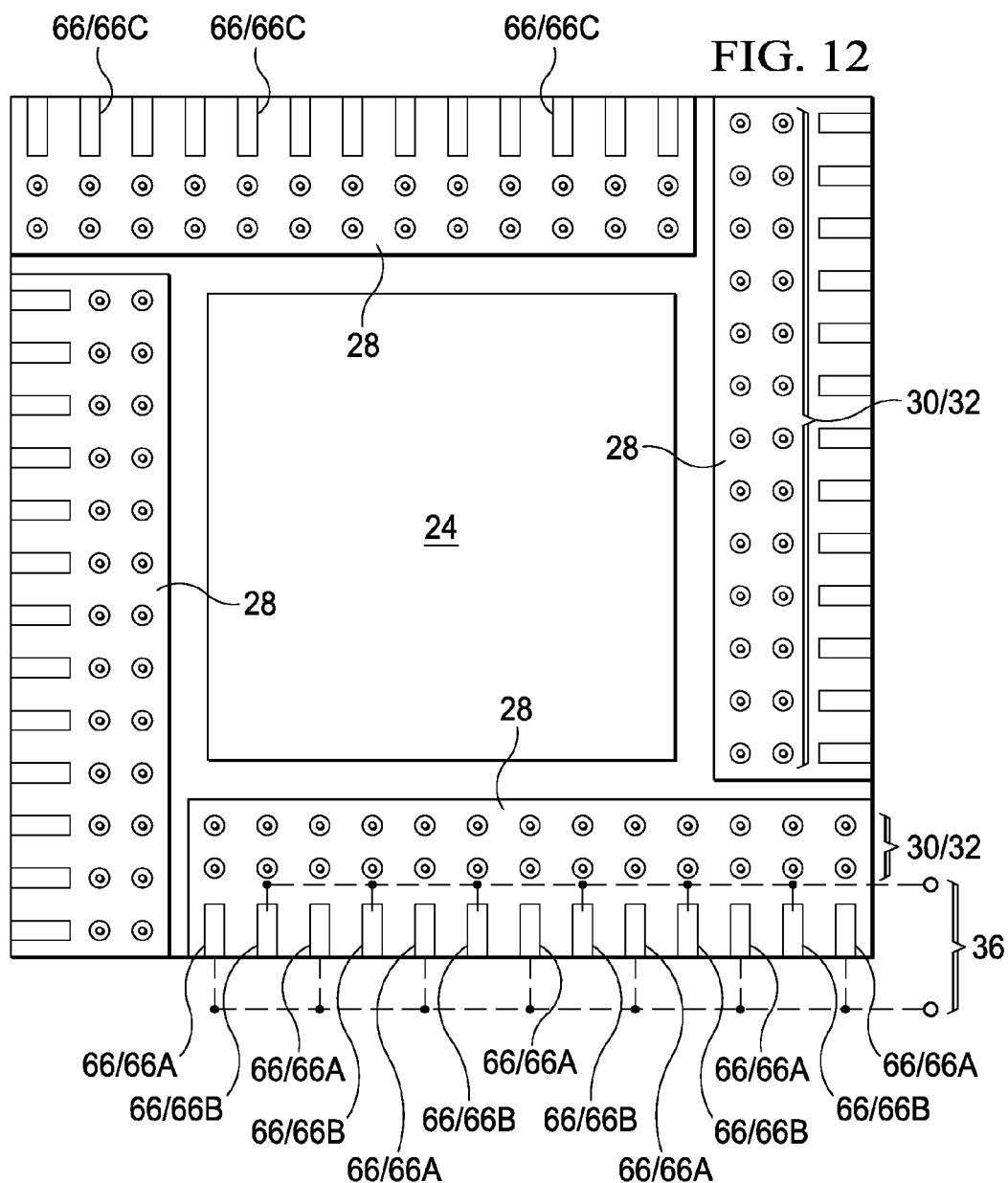

POP STRUCTURES INCLUDING THROUGH-ASSEMBLY VIA MODULES

BACKGROUND

In a conventional Package-on-Package (POP) process, a top package is bonded to a bottom package. The top package and bottom package may also have device dies packaged therein. By adopting the PoP process, the integration level of the packages may be increased.

In an existing PoP process, the bottom package is formed first, which includes a device die bonded to a package substrate. A molding compound is then molded on the package substrate, wherein the device die is molded in the molding compound. The package substrate further includes solder balls formed thereon, wherein the solder balls and the device die are on a same side of the package substrate. The solder balls are used for connecting the top package to the bottom package. Accordingly, the heights of the solder balls need to be greater than the thickness of the device die, so that the top portions of the solder balls may protrude above the top surface of the device die, and above the top surface of the molding compound. Accordingly, the lateral sizes of the solder balls are also large, and the amount of the solder balls that can be used in a PoP structure is limited.

BRIEF DESCRIPTION OF THE DRAWINGS

For a more complete understanding of the embodiments, and the advantages thereof, reference is now made to the following descriptions taken in conjunction with the accompanying drawings, in which:

FIG. 12 illustrates a top view of a package component and Through-Assembly Via (TAV) modules placed on a carrier and a release layer.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Package-on-Package (PoP) structure and the methods of forming the same are provided in accordance with various exemplary embodiments. The intermediate stages of forming the PoP structure are illustrated. The variations of the embodiments are discussed. Throughout the various views and illustrative embodiments, like reference numbers are used to designate like elements.

Figure 1:
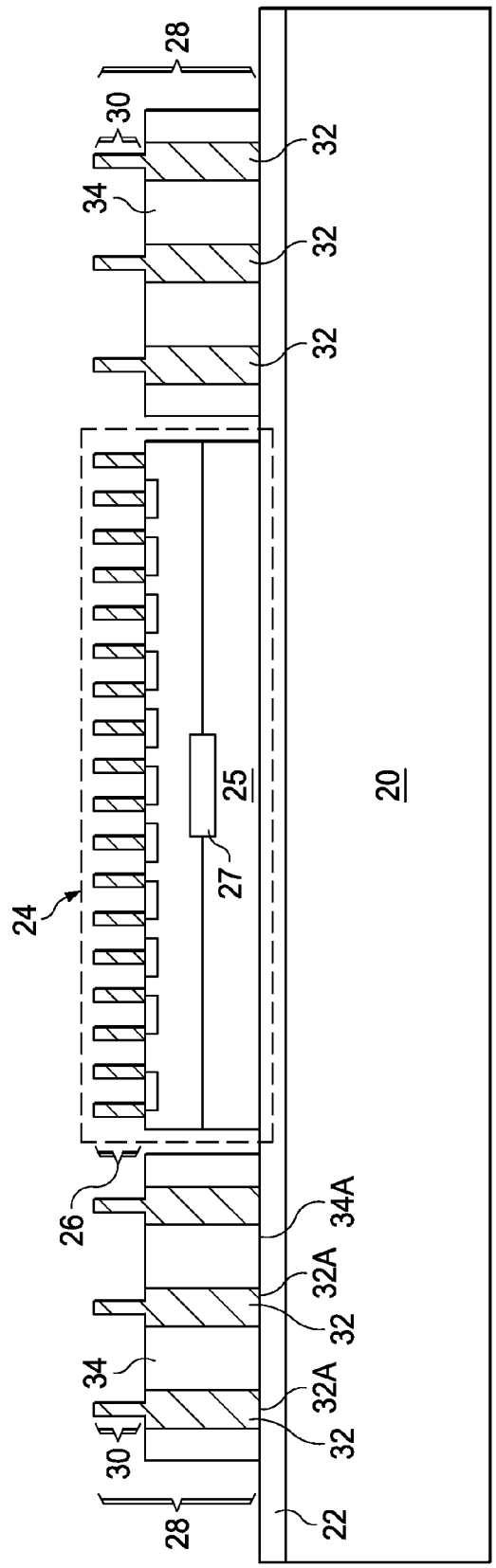
FIGS. 1 through 9 are cross-sectional views and a top view of intermediate stages in the manufacturing of a Package-on-Package (PoP) structure in accordance with some exemplary embodiments.

FIGS. 1 through 9 are cross-sectional views and a top view of intermediate stages in the manufacturing of a Package-on-Package (PoP) structure in accordance with some exemplary embodiments. FIG. 1 illustrates carrier 20 and release layer 22 on carrier 20. Carrier 20 may be a glass carrier, a ceramic carrier, or the like. Release layer 22 may be formed of an adhesive such as an Ultra-Violet (UV) glue. Package component 24 and Through-Assembly Via (TAV) modules 28 are then placed on release layer 22. The bottom surfaces of package component 24 and TAV modules 28 are in contact with the top surface of release layer 22, and are level with each other. The position of package component 24 and TAV modules 28 are accurately aligned to desirable locations, so that the subsequent formed redistribution lines may electrically couple to metal posts 26 and 30. In some embodiments, package component 24 includes one or a plurality of device dies. For example, package component 24 may include a Central Computing Unit (CPU) die or another type of logic die having logic circuits. In alternative embodiments, package component 24 includes a plurality of memory dies stacked together (please refer to FIG. 11). In the embodiments wherein package component 24 is a device die, package component 24 may include semiconductor substrate 25 and active devices (such as transistors) 27 at a top surface of semiconductor substrate 25. The bottom surface of semiconductor substrate 25 is thus in contact with release layer 22. Semiconductor substrate 25 may be free from through-substrate vias formed therein, although through-substrate vias may also be formed to penetrate through semiconductor substrate 25. Package component 24 may also be a package that includes device die(s), interposer(s), package substrate(s) (not shown), and/or the like. Metal posts 26 (such as copper posts) are formed as a top portion of package component 24.

TAV modules 28 are integrated modules that are preformed before being placed on release layer 22. TAV modules 28 include substrate 34, which may be a semiconductor substrate such as a silicon substrate. Alternatively, substrate 34 is a dielectric substrate such as a glass substrate. Through-substrate vias 32 are formed in substrate 34 for inter-coupling the conductive features on opposite sides of substrate 34. Through-substrate vias 32 are formed of a conductive material, which may include copper, aluminum, tungsten, and/or the like. In some embodiments, bottom ends 32A of through-substrate vias 32 are level with the bottom surface 34A of substrate 34. Accordingly, bottom ends 32A of through-substrate vias 32 may be in contact with release layer 22. TAV modules 28 may also include metal posts 30 (such as copper posts) formed as top portions of TAV modules 28. The top surfaces of metal post 26 and 30 are substantially level with each other.

No active devices such as transistors are formed in TAV modules 28. In accordance with some embodiments, TAV modules 28 do not include passive devices such as capacitors, inductors, resistors, and/or the like. In alternative embodiments, TAV modules 28 may include the passive devices therein. Exemplary capacitor 36 is illustrated in FIG. 12, which capacitor 36 includes two or more parallel metal strips 66 that penetrate through substrate 34 to form the capacitor plates of capacitor 36. TAV modules 28 may include redistribution layer(s) that include redistribution lines and metal pads on the top sides of TAV modules 28. Alternatively, no redistribution layer is formed on either side of one or each of TAV modules 28, and metal posts 30 are connected to, and are aligned to, through-substrate vias 32, with no redistribution lines between metal posts and through-substrate vias 32.

Figure 2:
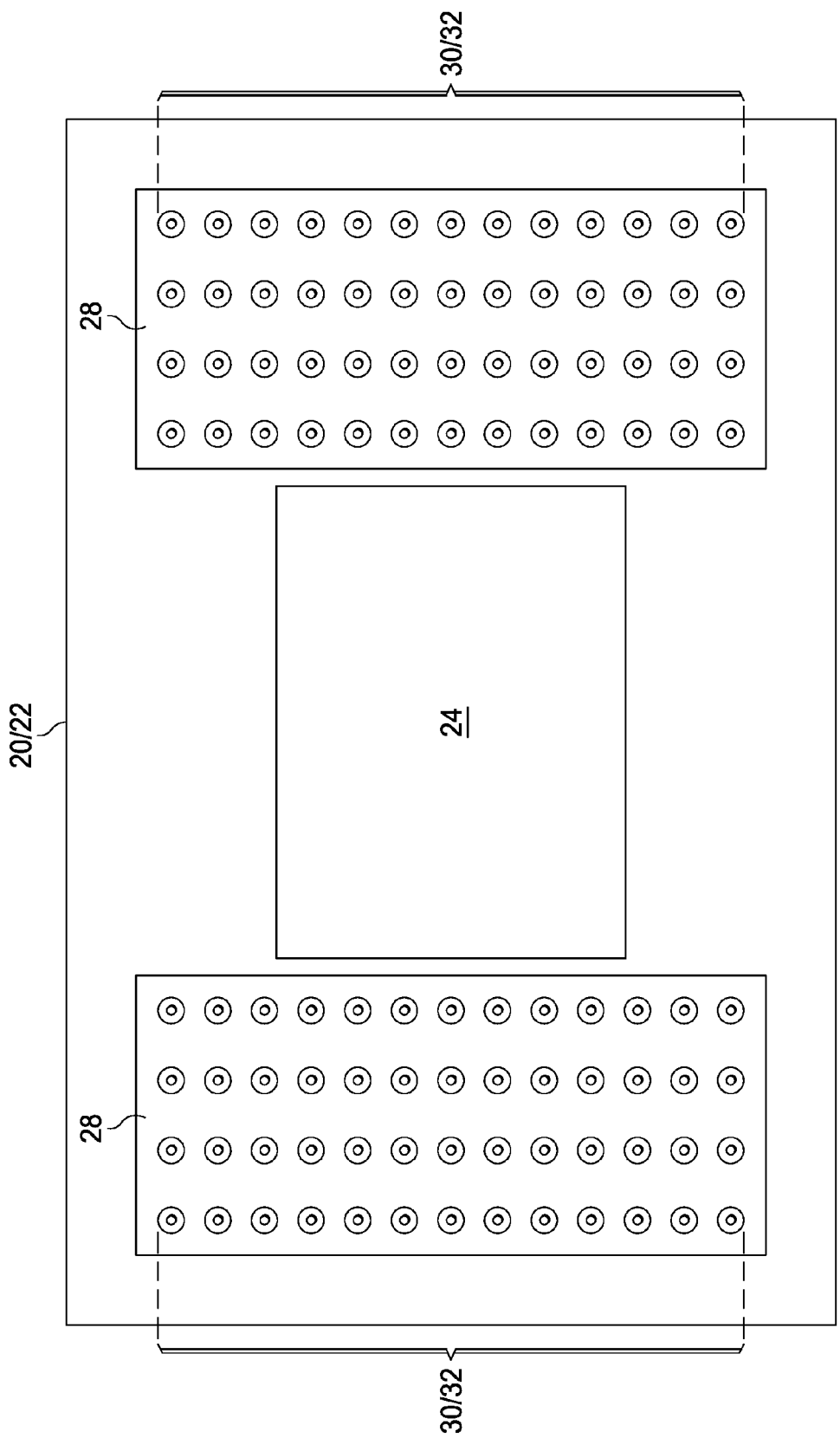

FIG. 2 illustrates a top view of the structure in FIG. 1. In accordance with some embodiments, TAV modules 28 are disposed on opposite sides of package component 24. Although two TAV modules 28 are illustrated, there may be one or more than two TAV modules 28. TAV modules 28 may have an identical structure. Alternatively, TAV modules 28 may have different structures with different counts of metal posts 30, different layouts of metal posts 30, different sizes, and/or different materials. The plurality of TAV modules 28 may be laid out on release layer 22 with any layout.

Figure 3:
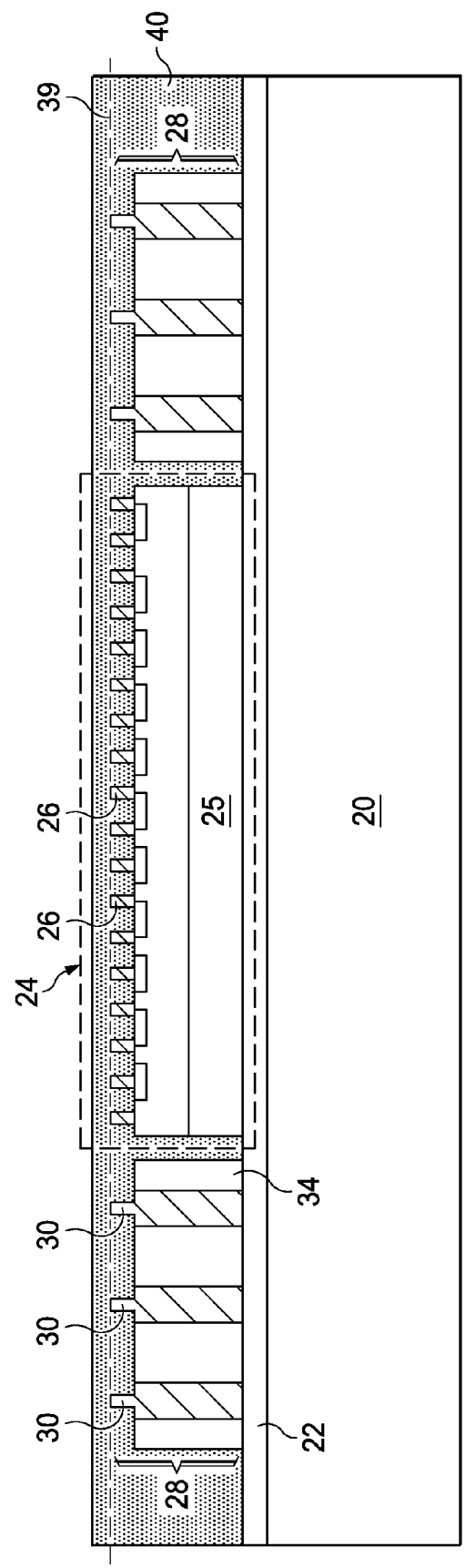

Referring to FIG. 3, polymer 40 is molded on package component 24 and TAV modules 28. Polymer 40 fills the gaps between package component 24 and TAV modules 28, and may be in contact with release layer 22. Furthermore, polymer 40 is filled into the gaps between metal posts 26, and into the gaps between metal posts 30. Polymer 40 may include a molding compound, a molding underfill, or a kind of epoxy. The top surface of polymer 40 may be level with or higher than the top surfaces of metal posts 26 and 30. A grinding step may be performed to grind polymer 40, until metal posts 26 and 30 are exposed. Line 39 marks an exemplary position of the top surface of polymer 40 after the grinding.

Figure 4:
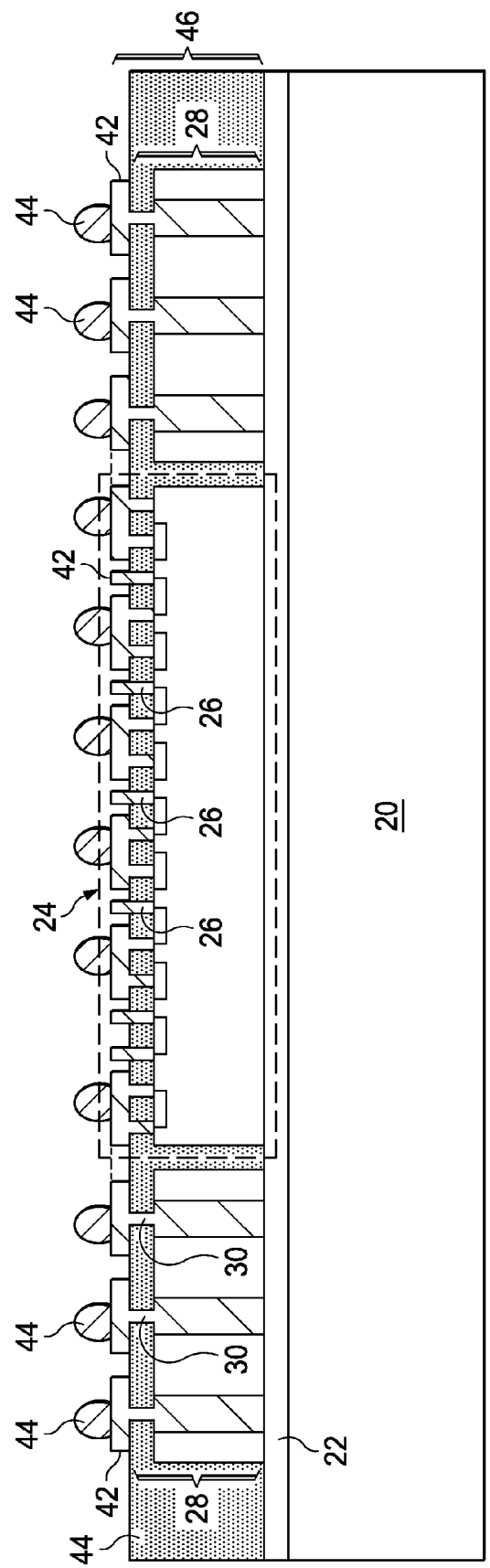

Next, referring to FIG. 4, Redistribution Lines (RDLs) 42 and connectors 44 are formed to connect to metal posts 26 and 30. As indicated by dashed lines, RDLs 42 may also interconnect metal posts 26 and 30. RDLs 42 may be formed by depositing a metal layer, and then patterning the metal layer. In some exemplary embodiments, the formation of connectors 44 includes placing solder balls on the exposed portions of RDLs 42, and then reflowing the solder balls. In alternative embodiments, the formation of connectors 44 includes performing a plating step to form solder regions on RDLs 42, and then reflowing the solder regions. Connectors 44 may also include metal pillars, or metal pillars and solder caps, which may also be formed through plating. Throughout the description, the structure including package component 24, TAV modules 28, and polymer 40 is referred to as package 46.

Figure 5:
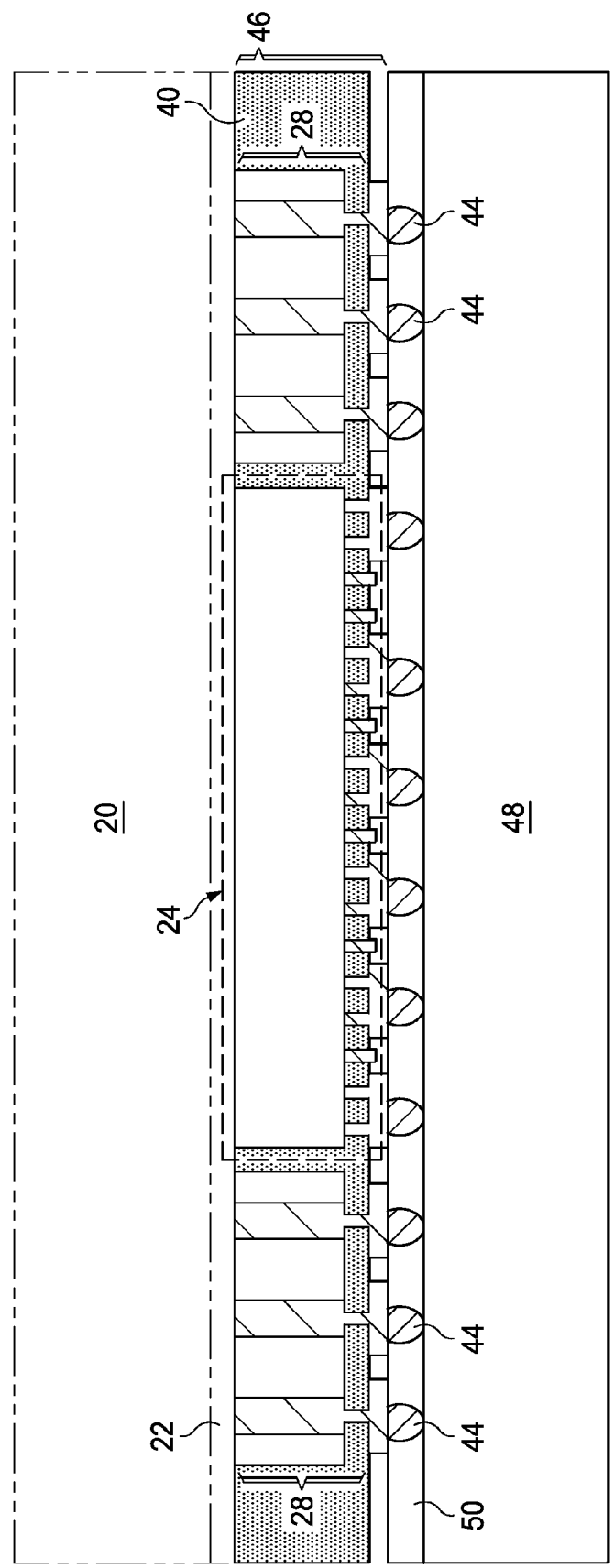

Referring to FIG. 5, a carrier switch is performed. In the carrier switch process, carrier 48 is first attached to package 46, wherein carriers 20 and 48 are on the opposite sides of package 46. Carrier 48 may be attached to package 46 through adhesive 50, which may be a UV glue, a tape, or the like. Carrier 20 is then detached from package 46 by making release layer 22 to lost adhesion. Release layer 22 is then removed. For example, when release layer 22 is formed of the UV glue, release layer 22 may be exposed to the UV light, so that release layer 22 loses adhesion, and hence carrier 20 and release layer 22 can be removed from package 46.

Figure 6:
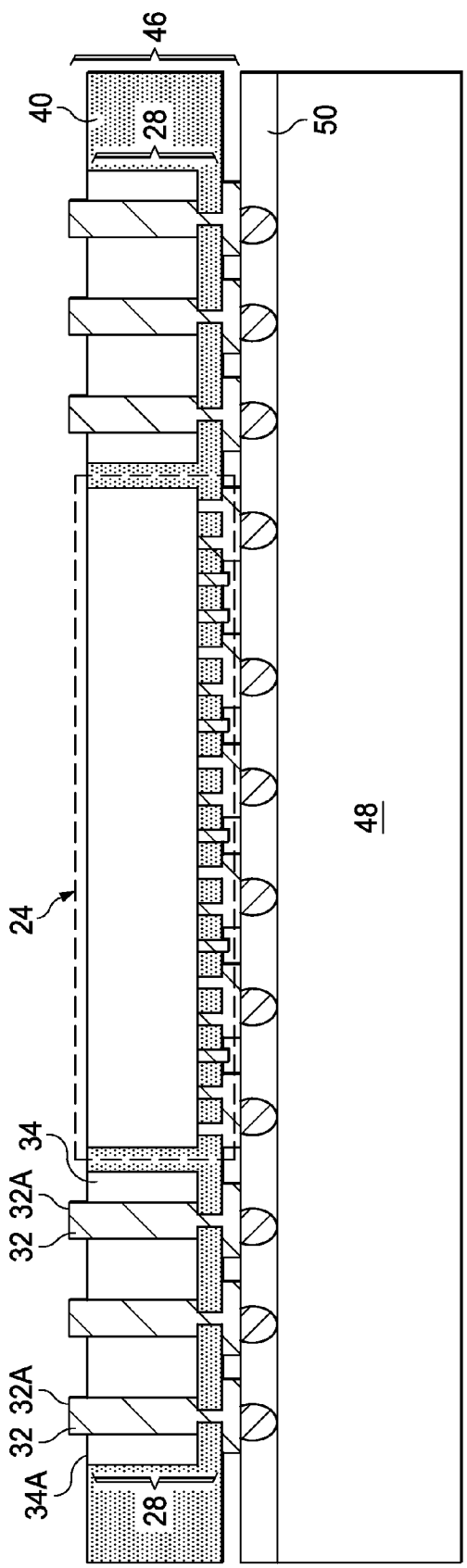

Referring to FIG. 6, after the carrier switch, the back surface of TAV modules 28 is exposed, and through-substrate vias 32 in TAV modules 28 are exposed. In some embodiments, a grinding is performed to lightly grind the back surface of package component 24 and TAV modules 28, so that through-substrate vias 32 protrude above the back surface of substrate 34. Alternatively, the grinding step is skipped. When no grinding is performed, surfaces 32A of through-substrate vias 32 are level with back surface 34A of substrate 34.

Figure 7:
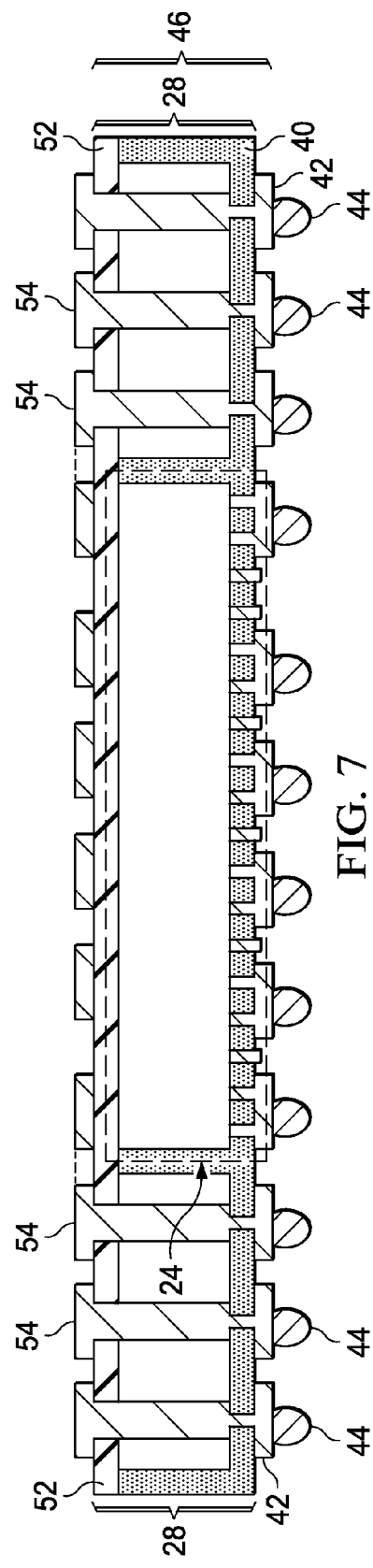

As shown in FIG. 7, dielectric layer 52 is formed on the illustrated top surface of package 46. In some embodiments, dielectric layer 52 includes a polymer, which may be polyimide, benzocyclobutene (BCB), or the like. Dielectric layer 52 may also be formed of a light-sensitive material, which may be exposed in a lithography step, and then patterned. Alternatively, dielectric layer 52 may be formed of other materials such as oxides, nitrides, combination thereof, and multiplayers thereof. RDLs 54 are then formed on dielectric layer 52 and connected to RDLs 54. RDLs 54 may extend to over and aligned to package component 24. Accordingly, RDLs 54 have a fan-in structure. The RDLs 54 that are over and aligned to package component 24 may be connected to the RDLs over and aligned to TAV modules 28. The dashed portions of RDLs 54 illustrate the connecting portions of RDLs 54. Next, carrier 48 (FIG. 6) is demounted from package 46. The formation of package 46 is thus finished.

Figure 8:
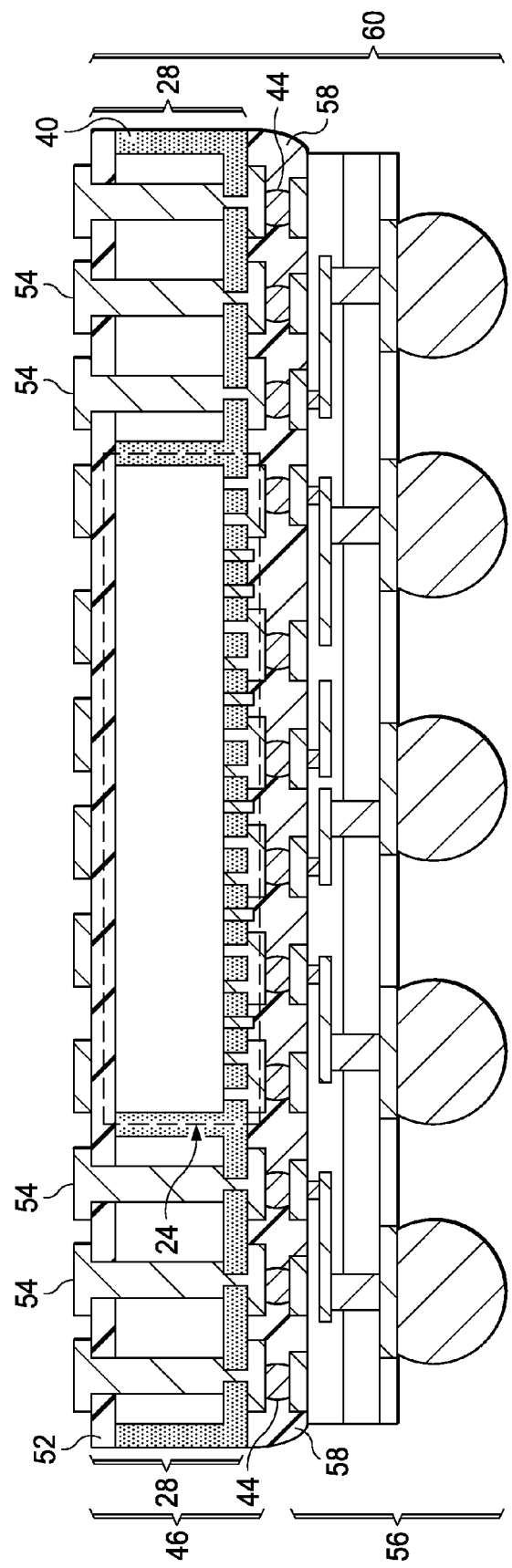

Referring to FIG. 8, package 46 is bonded to package component 56 to form bottom package 60. Package component 56 may be a package substrate, an interposer, a device die, a Printed Circuit Board (PCB), or the like. Polymer 58 is dispensed between package 46 and package component 56. Polymer 58 may be an underfill or a molding underfill. Alternatively, package 60 may be molded, for example, using compress molding, and RDLs 54 are exposed through the respective molding compound (not shown).

Figure 9:
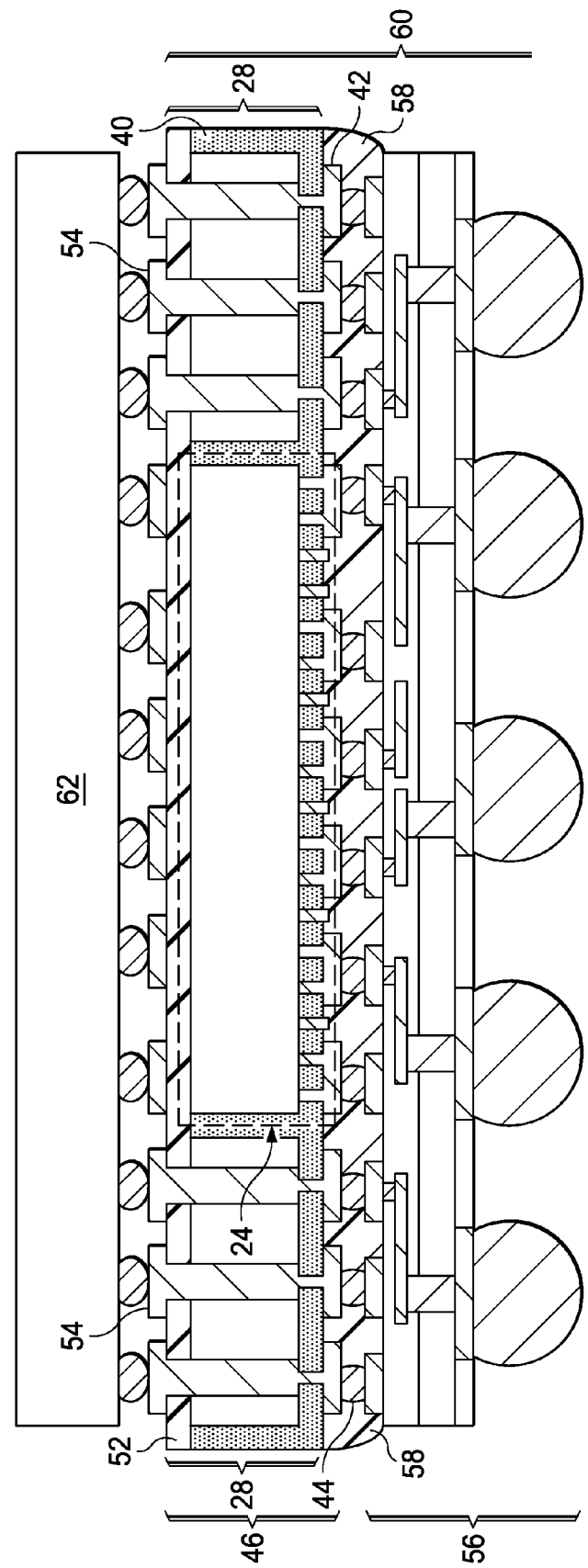

FIG. 9 illustrates the bonding of top package component 62 to bottom package 60. In some embodiments, top package component 62 is a device die. Alternatively, package component 62 is a package that includes a device die (not shown) bonded to a package substrate (not shown), an interposer (not shown), or the like. In the resulting package, TAV modules 28 are used to electrically couple the circuit devices in package component 62 to package component 56.

Figure 10:
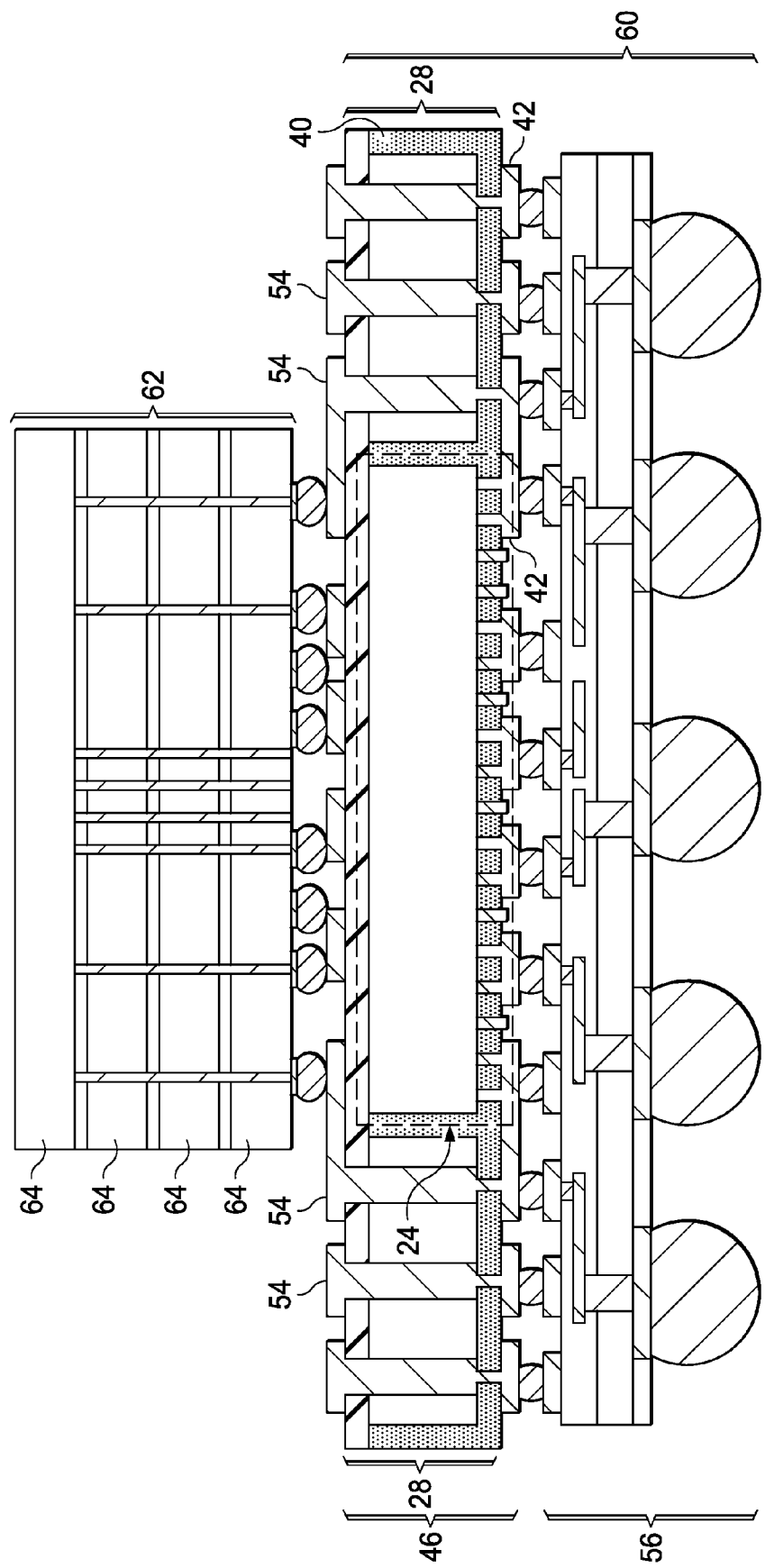
FIGS. 10 and 11 are cross-sectional views of the PoP structures in accordance with alternative exemplary embodiments.
Figure 11:
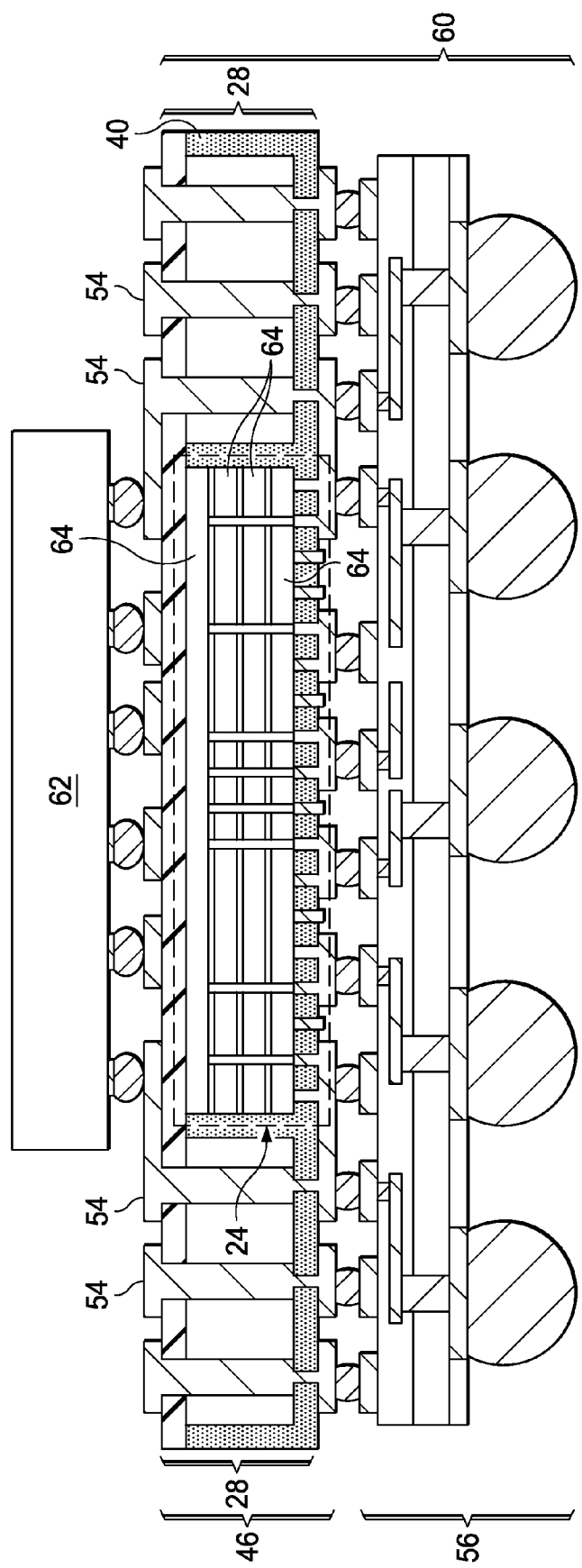

FIG. 10 illustrates an exemplary embodiment wherein package component 62 includes a plurality of stacked dies 64. In some embodiments, stacked dies 64 are memory dies. Stacked dies 64 may be bonded to RDLs 54 that are over and aligned to package component 24, which are further connected to the RDLs 54 over and aligned to TAV modules 28. In these embodiments, package component 24 may be electrically coupled to stacked dies 64, for example, through RDLs 54, TAV modules 28, RDLs 42, and/or package component 56. FIG. 11 illustrates alternative embodiments, wherein the positions of stacked dies 64 and package component 24 are swapped as compared to FIG. 10.

In the embodiments, the connection between top package component 62 and bottom package 60 is through TAV modules 28, rather than large solder balls. Since TAV modules 28 may be formed using lithography processes and/or other processes that are used on silicon substrates, the pitches and the sizes of through-substrate vias 32 may be very small. Accordingly, the number of connections between top package component 62 and bottom package 60 is increased. The throughput of the packaging process is also high.

FIG. 12 illustrates a top view of the structure in FIG. 1 in accordance with alternative embodiments. In TAV modules 28, besides through-substrate vias 32, which are used for electrically connecting the features on opposite sides of TAV modules 28, strip-shaped vias 66 may also be formed. In accordance with some embodiments, strip-shaped vias 66 are used for dissipating the heat generated in package component 24 as in FIGS. 9 through 11. Accordingly, strip-shaped vias 66 (such as 66C) may be electrically floating when TAV modules 28 are used in the package structure in FIGS. 9 through 11. In these embodiments, since strip-shaped vias 66C are formed of metals that have good thermal conductivity, the heat dissipating ability is improved over that of molding compound. In alternative embodiments, strip-shaped vias 66 may be interconnected to form a capacitor. For example, in FIG. 12, strip-shaped vias 66 include strip-shaped vias 66A that are interconnected to form one of the capacitor plates, and strip-shaped vias 66B that are interconnected to form the other capacitor plate. Strip-shaped vias 66A and strip-shaped vias 66B are laid out in an alternating pattern to increase the capacitance.

In accordance with embodiments, a device includes a TAV Module, which includes a substrate, a plurality of through-vias penetrating through the substrate, and a second plurality of metal posts at a bottom surface of the TAV module and electrically coupled to the plurality of through-vias. A polymer includes a first portion between and contacting sidewalls of the first package component and the TAV module, a second portion disposed between the first plurality of metal posts, and a third portion disposed between the second plurality of metal posts. A first plurality of RDLs is underlying a bottom surface of the second and the third portions of the polymer. A second plurality of RDLs is over the first package component and the TAV module. The first plurality of RDLs is electrically coupled to the second plurality of RDLs through the plurality of through-vias in the TAV module.

In accordance with other embodiments, a device includes a bottom package, and a top package component bonded to the bottom package. The bottom package includes a package substrate, a plurality of connectors over the package substrate, and a package. The package includes a device die, and a TAV Module substantially level with the device die. The TAV module is free from active devices therein, and includes a substrate and a plurality of through-vias penetrating through the substrate. A molding compound contacts a bottom surface of the device die, a bottom surface of the TAV module, and sidewalls of the device die and the TAV module. A plurality of RDLs is under the molding compound and electrically coupled to the device die and the plurality of through-vias in the TAV module. The plurality of RDLs is bonded to the package substrate through the plurality of connectors.

In accordance with yet other embodiments, a method includes placing a device die over a release layer, wherein the release layer is over a first carrier. A TAV module is placed over the release layer, wherein the TAV module is free from active devices therein, and wherein the TAV module includes a substrate and a plurality of through-vias penetrating through the substrate. The device die and the TAV module are molded in a polymer. The polymer is ground to expose metal posts of the device die and metal posts of the TAV module. A first plurality of RDLs is formed over the polymer and connected to the metal posts of the device die and the metal posts of the TAV module, wherein the device die, the TAV module, and the first plurality of RDLs form a package. The package is mounted on a second carrier, wherein the first and the second carriers are on opposite sides of the package. The first carrier is demounted from the package. The release layer is removed. A second plurality of RDLs is formed to couple to the plurality of through-vias, wherein the first and the second plurality of RDLs are on opposite sides of the package. The second carrier is demounted from the package.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a first package component;
   a first plurality of metal posts at a bottom surface of the first package component and electrically coupled to the first package component;
   a Through-Assembly Via (TAV) Module comprising:
      a substrate;
      a strip-shaped via in the substrate, wherein the strip-shaped via is electrically floating;
      a plurality of through-vias penetrating through the substrate, wherein each of the plurality of through-vias comprises a straight sidewall extending from a top surface to a bottom surface of the substrate; and
      a second plurality of metal posts at a bottom surface of the TAV module and electrically coupled to the plurality of through-vias;
   a polymer comprising:
      a first portion between and contacting sidewalls of the first package component and the TAV module;
      a second portion disposed between the first plurality of metal posts; and
      a third portion disposed between the second plurality of metal posts;
   a first plurality of Redistribution Lines (RDLs) underlying a bottom surface of the second and the third portions of the polymer; and
   a second plurality of RDLs over the first package component and the TAV module, wherein the first plurality of RDLs is electrically coupled to the second plurality of RDLs through the plurality of through-vias in the TAV module.

2. The device of claim 1, wherein the first package component comprises a semiconductor substrate having a top surface level with the top surface of the substrate of the TAV module.

3. The device of claim 2 further comprising a dielectric layer over and contacting the top surface of the semiconductor substrate of the first package component, the top surface of the substrate of the TAV module, and the first portion of the polymer.

4. The device of claim 1, wherein the TAV module is free from active devices therein.

5. The device of claim 1, wherein the substrate of the TAV module is a dielectric substrate.

6. The device of claim 1, wherein the plurality of through-vias further comprises:
   a first plurality of through-vias interconnected to form a first capacitor plate of a capacitor; and
   a second plurality of through-vias interconnected to form a second capacitor plate of the capacitor.

7. A device comprising:
   a bottom package comprising:
      a package substrate;
      a plurality of connectors over the package substrate;
      a package comprising:
         a device die;
         a Through-Assembly Via (TAV) module substantially level with the device die, wherein the TAV module is free from active devices therein, and wherein the TAV module comprises a substrate and a plurality of through-vias penetrating through the substrate, wherein the plurality of through-vias comprises strip-shaped vias, with alternating ones of the strip-shaped vias interconnected to form capacitor plates of a capacitor; and
         a molding compound contacting a bottom surface of the device die, a bottom surface of the TAV module, and sidewalls of the device die and the TAV module; and
      a first plurality of Redistribution Lines (RDLs) under the molding compound and electrically coupled to the device die and the plurality of through-vias in the TAV module, wherein the first plurality of RDLs is bonded to the package substrate through the plurality of connectors; and
   a top package component bonded to the bottom package.

8. The device of claim 7, wherein the package in the bottom package further comprises:
   a dielectric layer contacting a top surface of the device die and a top surface of the TAV module; and a second plurality of RDLs over the dielectric layer and coupled to the plurality of through-vias in the TAV module, wherein the second plurality of RDLs is bonded to the top package component.

9. The device of claim 8, wherein the top surface of the device die is level with the top surface of the TAV module.

10. The device of claim 7, wherein each of the plurality of through-vias comprises a straight sidewall extending from a top surface to a bottom surface of the substrate.

11. The device of claim 7 further comprising an additional TAV module level with the TAV module, wherein the additional TAV module is spaced apart from the TAV module by a portion of the molding compound.

12. The device of claim 7, wherein the substrate of the TAV module is a dielectric substrate.

13. The device of claim 7, wherein one of the plurality of through-vias is electrically floating.

14. A device comprising:
a package comprising:
    a device die;
    a Through-Assembly Via (TAV) module free from active devices and passive devices therein, wherein the TAV module comprises a first substrate and a plurality of through-vias penetrating through the first substrate, wherein the plurality of through-vias further comprises:
        a first plurality of through-vias interconnected to form a first capacitor plate of a capacitor; and
        a second plurality of through-vias interconnected to form a second capacitor plate of the capacitor; and
    a molding compound encircling each of the device die and the TAV module; and
    a first plurality of Redistribution Lines (RDLs) and a second plurality of RDLs electrically coupled to the plurality of through-vias, wherein the first plurality of RDLs and the second plurality of RDLs are on opposite sides of the plurality of through-vias.

15. The device of claim 14, wherein the molding compound comprises a first surface coplanar with a second surface of the first substrate and a third surface of a second substrate of the device die.

16. The device of claim 15, wherein the molding compound comprises a fourth surface opposite to the first surface, wherein the fourth surface is coplanar with surfaces of the plurality of through-vias, and the device die comprises a plurality of metal posts comprising surfaces coplanar with the fourth surface of the molding compound.

17. The device of claim 15, wherein each of the first substrate and the second substrate is a semiconductor substrate.

18. The device of claim 15 further comprising a polymer layer contacting the first surface of the molding compound, wherein the plurality of through-vias penetrates through the polymer layer.

* * * * *